United States Patent [19]

Yamagata

[11] Patent Number: 5,653,802
[45] Date of Patent: Aug. 5, 1997

[54] METHOD FOR FORMING CRYSTAL

[75] Inventor: Kenji Yamagata, Kawasaki, Japan

[73] Assignee: Canon Kabushiki Kaisha, Tokyo, Japan

[21] Appl. No.: 452,863

[22] Filed: May 30, 1995

Related U.S. Application Data

[63] Continuation of Ser. No. 205,341, Mar. 3, 1994, abandoned, which is a continuation of Ser. No. 978,470, Nov. 19, 1992, abandoned, which is a continuation of Ser. No. 793,290, Nov. 14, 1991, abandoned, which is a continuation of Ser. No. 328,458, Mar. 24, 1989, abandoned.

[30] Foreign Application Priority Data

Mar. 27, 1988 [JP] Japan .................. 63-072897
Mar. 23, 1989 [JP] Japan .................. 1-73031

[51] Int. Cl.⁶ .................................................. C30B 25/04
[52] U.S. Cl. .................................. 117/90; 117/94; 117/95; 117/96; 117/97; 117/935; 438/479; 438/974
[58] Field of Search .......................... 117/90, 94, 95, 117/96, 97, 935; 148/DIG. 81, DIG. 82; 437/17, 20; 365/182

[56] References Cited

U.S. PATENT DOCUMENTS

| | | | |
|---|---|---|---|
| 3,620,833 | 11/1971 | Gleim et al. | 117/212 |
| 4,021,675 | 5/1977 | Shifrin | 437/20 |
| 4,249,962 | 2/1981 | Celler | 437/17 |
| 4,800,527 | 1/1989 | Ozaki et al. | 365/182 |

FOREIGN PATENT DOCUMENTS

| | | |
|---|---|---|
| 55-050636 | 4/1980 | Japan . |
| 56-024925 | 3/1981 | Japan . |

OTHER PUBLICATIONS

Jastrzebski et al. "Growth Process of Silicon Over $SiO_2$ by CVD: Elo" Journal Electrochem. Soc. Jul. 1983 pp. 1571–1579 vol. 130 No. 7.

Primary Examiner—Robert Kunemund
Attorney, Agent, or Firm—Fitzpatrick, Cella, Harper & Scinto

[57] ABSTRACT

A method for forming a crystal comprises implanting ions on the surface of a substrate to change the ion concentration in the depth direction of said substrate surface by said ion implantation, subjecting a desired position of said substrate surface with a sufficient area for crystal growth from a single crystal to exposure treatment to/he depth where an exposed surface having larger nucleation density than the nucleation density of the surface of said substrate is exposed, thereby forming a nucleation surface comprising said exposed surface exposed by said exposure treatment and a nonnucleation surface comprising the surface of the substrate remaining without subjected to said exposure treatment, applying a crystal growth treatment for crystal growth from a single nucleus on said substrate to grow a single crystal from said single nucleus or form a polycrystal of a mass of single crystals grown from said single nucleus.

6 Claims, 6 Drawing Sheets

METHOD FOR FORMING CRYSTAL

This application is a continuation of application Ser. No. 08/205,341 filed Mar. 3, 1994, now abandoned, which is a continuation of application Ser. No. 07/978,470 filed Nov. 19, 1992, now abandoned, which is a continuation of application Ser. No. 07/793,290 filed Nov. 14, 1991, now abandoned, which is a continuation of application Ser. No. 07/328,458 filed Mar. 24, 1989, which is now abandoned.

BACKGROUND OF THE INVENTION

1. Field of the Invention

This invention relates to a method for forming a crystal, particularly to a method for forming a crystal by utilizing the difference in nucleation density (ΔND).

The present invention may be suitably used for, for example, formation of crystals such as single crystals, polycrystals, etc. which can be preferably used for functional devices such as electronic devices, optical devices, magnetic devices, piezoelectric devices and surface acoustic devices of semiconductor integrated circuits, optical integrated circuits, magnetic circuits, etc.

2. Related Background Art

In the prior art, single crystal thin films to be used for functional devices such as electronic devices optical devices, etc. using semiconductor materials have been formed by epitaxial growth on a single crystal substrate. For example, on a Si single crystal substrate (silicon wafer), St, Ge, GaAs, etc. have been known to be epitaxially grown from liquid phase, gas phase or solid phase. Also on a GaAs single crystal substrate, a single crystal such as of GaAs, GaAlAs, etc. has been known to be epitaxially grown. By use of a crystalline semiconductor thin film thus formed, a semiconductor device, an integraton circuit, or an emission device such as semiconductor laser, LED, etc. is prepared.

Also, recently, research and development of an ultra-high speed transitor by two-dimensional electronic gas, ultra-lattice device utilizing quantum well, etc. has been active done, and these techniques have been made possible by the high precision epitaxial techniques such as MBE (molecular beam epitaxy) or MOCVD (metal organic chemical vapor deposition) by use of ultra-high vacuum.

In such epitaxial growth on a single crystal substrate, it is necessary to match the lattice constants and the thermal expansion coefficients between the single crystal material and the epitaxial growth layer. If this matching is insufficient, lattice defects will developed in the epitaxial layer. Also, the elements constituting the substrate may be sometimes diffuse into the epitaxial layer.

Thus, it can be understood that the method of forming a single crystal semiconductor thin film of the prior art by epitaxial growth depends greatly on its substrate material. Mathews et al examined combinations of the substrate materials and epitaxial growth layers (EPITAXIAL GROWTH, Academic Press, New York, 1975, ed. by J. W. Mathews).

Also, the size of the substrate is presently about 6 inches, in the case of Si wafers. In view of productivity and low cost, using enlarger of GaAs and sapphire substrates is further not favored. Besides, a single crystal substrate is expensive and therefore the cost per chip becomes high.

Thus, for forming a good quality single crystal layer of capable of forming a functional device having excellent characteristics according to the prior art, there has been the problem that the substrate materials are limited to a very narrow scope.

On the other hand, there have been actively resarches and development of three-dimensional integrated circuits which accomplish higher integration and higher functions by forming semiconductor devices in the normal direction of the substrate by lamination. Also researches and development on large area semiconductor devices such as solar batteries having devices arranged in an array on an inexpensive glass, liquid display devices provided with switching transistors, etc. are becoming abundant year by year. I What is common to both of these they require a technique to form a semiconductor thin film on an amorphous insulating material and form an electronic device such as transistor, etc. there. Among them, particularly it has been desired to have a technique for forming a single crystal semiconductor of high quality on an amorphous insulating material.

Generally speaking, when a thin film is deposited on an amorphous insulating material substrate such as $SiO_2$, etc., due to deficiency of long distance order of the substrate material, the crystal structure of the deposited film becomes amorphous or polycrystalline. Here, amorphous film is one under the state where, although the short distance order to the extent of the minimum approximate atoms is preserved, there is no longer distance order than that. While polycrystalline film is a collection of single crystal grains having no specific crystal direction separated by grain boundaries.

For example, when Si film is formed on $SiO_2$ by the CVD method, if the deposition temperature is about 600° C. or lower, it becomes amorphous silicon film, or if it is higher than that temperature, it becomes a polycrystal silicon with a distribution of grain sizes from some 100 to some 1000 Å. However, the grain sizes and the distribution thereof will vary greatly depending on the formation method.

Further, a polycrystlline thin film of large grain sizes of about micron or millimeter has been obtained by melting and solidifying an amorphous film or polycrystalline film with an energy beam such as laser, rod-shaped heater, etc. (Single-Crystal silicon on non-single-crystal insulators, Journal of crystal Growth vol. 63, No. 3, October, 1983, edited by G. W. Cullen).

When a transistor is formed on the thin film of each crystal structure thus formed and the electron mobility is measured from the actuation characteristics of said transistor, a mobility of ca. 0.1 $cm^2/V.sec$ is obtained in the case of amorphous silicon, 1 to 10 $cm^2/V.sec$ in the case of a polycrystalline silicon film having an average grain size of some 100 Å, and a value to the same extent as in the case of single crystal silicon film in the polycrystalline silicon film with enlarged grain sizes by melting and solidification.

From these results, it can be understood that the device formed in the single crystal region within the crystal grain and the device formed as bridging over the grain boundary differ greatly in their electrical characteristics. More specifically, the deposited film on an amorphous material obtained by the prior art method becomes amorphous or polycrystalline structure having a grain size distribution. The semiconductor device formed in such a deposited film becomes Greatly inferior in its performance as compared with the semiconductor device formed in a single crystal film. For this reason, the uses are limited to simple switching devices for which no high conversion efficiency is demanded, such as solar batteries or photoelectric converting devices, etc.

Also, the method of forming a polycrystalline thin film with large grain sizes by melting and solidification had the problem that it took a very long time enlarge grain sizes and was poor in productivity, because amorphous film or polycrystalline thin film is scanned with energy beam for each wafer. It was also not suitable for enlargement of area.

Also, within the polycrystalline film thus formed, there exist randomly a large number of grain boundaries, which cause poor characteristics when a semiconductor device is prepared by use of said polycrystalline film. Therefore, it has been strongly desired to have a method which can form a single crystal with high single crystallinity or a polycrystal which easily controls the position of the grain boundary and at low cost even on an amorphous film.

Accordingly, the present Applicant has proposed European Published Patent Application 244081 which discloses a method of providing a single crystal film containing no grain boundary, a polycrystal controlled in grain size or the position of grain boundary, etc., without restriction of the base material for forming the crystal, for example, without restriction of the material, the chemical composition, size, etc. of the substraate.

The above European Published Patent Application No. 244081 effects selective nucleus formation by utilizing the difference in nucleation density (AND) in the two kinds of materials with different nucleation densities (ND) depending on the place on the deposition surface relative to a certain deposition material (e.g. Si). Therefore, as the difference in nucleation density ($\Delta$ND) between two kinds of materials is greater, better selectivity can be obtained for selective nucleus formation.

The technical meanings of the words "nucleus", "nucleation surface", "nonnucleation surface" as mentioned in the published specification and the present application are as follows.

"Nucleus" refers to a stable nucleus having a size greater than the critical nucleus (the nucleus of which free energy becomes the maximum). Unless indicated otherwise, "nucleus" refers to a stable nucleus in this specification.

"Nucleation surface" refers to an artificial surface of fine area possessed by the substrate on which crystal growth treatment is applied for forming a stable nucleus and permitting a single crystal to grow from a single nucleus. It is formed of a material with large nucleation density.

"Nonnucleation surface" refers to a surface of the region for permitting no crystal to grow even if a nucleus is generated possessed by the substrate on which crystal growth treatment is applied, which covers substantially the whole surface of at least one surface of said substrate. It is formed of a material with small nucleation density.

For example, to describe by referring to FIG. 1, when $SiO_2$ is used for forming the nonnucleation surface material and $Si_3N_4$ for forming the nucleation surface material, it can be seen from the graph that the difference in nucleation density ($\Delta$ND) between the both is about $10^2$-fold relative to St. Substantially good selective nucleation is possible by use of the materials having such extent of difference in nucleation density ($\Delta$ND), but there may sometimes occur generation of a nucleus not only on the nucleation surface arranged at the desired position on the substrate but also on the nonnucleation surface (Error Nucleation). If the whole nucleation density (ND) is lowered too much by, for example, increasing the amount of HCl added for inhibiting such Error nucleus, there may occur such phenomenon as no formation of nuclues on the $Si_3N_4$ nucleation surface which is the, whereby yield is lowered.

Accordingly, to describe the case of utilizing $SiO_2$ for the non-nucleation surface and $SiO_2$ doped with Si ions for the nucleation surface, respectively, as shown in FIG. 1, one having Si ions implanted at a dosing amount of $2 \times 10^{16}$ cm$^{-2}$ implanted on $SiO_2$ has a difference in nucleation density ($\Delta$ND) of about $10^3$-fold from $SiO_2$ itself, and an extremely large difference in nucleation density ($\Delta$ND) can be created at a greater dosing amount. Therefore, even if the whole nucleation density (ND) may be lowered by controlling the amount of HCl gas added, nuclei are generated with good yield at the nucleation surface to form a single crystal grown from a single nucleus, and also generation of Error nucleus can be sufficiently inhibited at the non-nucleation surface, whereby formation of a crystal on the nonnucleation surface can be prevented. Thus, it can be understood that the above "ion implantation method" (hereinafter written as I/I method) is a very effective means for the selective nucleation method.

However, when the I/I method is practically practiced, the following inconveniences were found to occur in some cases. This is described by referring to FIGS. 2A–2C. First, for implanting ions in a fine nucleation region, the whole non-nucleation surface is required to be covered with a resist having a window opened at the fine nucleation region as mentioned above, and Si ions are implanted in the whole region including the nucleation surface and the nonnucleation surface (resist surface) (FIG. 2A). Next, the resist is removed with the use of an organic solvent, etc. (FIG. 2B). Whereas, at this time, only by implanting Si ions, something which appears to be denatured resist product remains in some cases. The above denatured product, according to the experiment by the present inventor, was sometimes generated when Si ions were implanted at a dosing amount of $3 \times 10^{16}$ cm$^{-2}$ or higher. Also, the denatured product contained carbon as the result of surface analysis, and it may also be estimated to remain in the form such as SiO. The above denatured product is a substance having very high nucleation density, and when selective nucleation is carried out, it has been also found that an Error nucleus may be sometimes formed with the denatured product as the center and grown to a crystal (FIG. 2C).

SUMMARY OF THE INVENTION

An object of the present invention is to provide a method for forming a crystal at a desired position on a substrate.

Another object of the present invention is to provide a method for forming a single crystal or a polycrystal controlled in grain size which is formed by utilizing the difference in nucleation density of the deposition surface materials due to the difference in composition of the deposition surface materials.

Still another object of the present invention is to provide a method for forming a single crystal or a polycrystal controlled in grain size and the position of grain boundary of high quality on an amorphous insulating material without restriction as to the material for forming the substrate surface.

Still another object of the present invention is to provide a method for crystal formation without remaining denatured resist product and adhered material due to the ion implantation energy without use of a resist during carrying out ion implantation on the substrate surface.

Still another object of the present invention is to provide a selective nucleation method in the I/I method which is very effective for selective nucleation, wherein, the plane with respect to the depth direction of the implanted ions (practically obtained by exposure treatment), the nucleation density (ND) of the surface is varied because of the concentration distribution of ions. The fine nucleation surface exposed by the exposure treatment such as dry etching, wet etching, etc. is used and the substrate surface remaining without being subjected to the exposure treatment is used as the nonnucleation surface.

According to the present invention, there is provided a method for forming a crystal, which comprises implanting ions on the surface of a substrate to change the ion concentration in the depth direction of said substrate surface by said ion implantation, subjecting a desired position of said substrate surface with a sufficient area for crystal growth from a single crystal to exposure treatment to the depth where an exposed surface having larger nucleation density than the nucleation density of the surface of said substrate is exposed, thereby forming a nucleation surface comprising said exposed surface exposed by said exposure treatment and a nonnucleation surface comprising the surface of the substrate remaining without subjected to said exposure treatment, applying a crystal growth treatment for crystal growth from a single nucleus on said substrate to grow a single crystal from said single nucleus or form a polycrystal of a mass of single crystals grown from said single nucleus.

The present invention also provides a method for forming a crystal, which comprises implanting ions on the surface of a substrate, subjecting a desired position of said substrate surface with a sufficient area for crystal growth from a single crystal to exposure treatment to the depth where an exposed surface having larger nucleation density than the nucleation density of the surface of said substrate is exposed, thereby forming a nucleation surface comprising said exposed surface exposed by said exposure treatment and a nonnucleation surface comprising the surface of the substrate remaining without being subjected to said exposure treatment, and applying a crystal growth treatment for crystal growth from a single nucleus on said substrate to grow a single crystal from said single nucleus or form a polycrystal of a mass of single crystals grown from said single nucleus.

According to the present invention, there is also provided a method for forming a crystal, which comprises subjecting a substrate having a nonnucleation surface with small nucleation density to doping of the whole surface of said nonnucleation surface, thereby ion implanting an ion by which nucleation density can be made greater than the nucleation density of said nonnucleation surface, subsequently carrying out etching of an area which is a desired position of the nonnucleation surface and sufficiently small for crystal growth only from a single nucleus to near the depth of the projection range of the implanted ion to form a nucleation surface so that the nucleation density of the fine surface exposed may become greater than the nucleation density of said nonnucleation surface, then applying a crystal formation treatment on said substrate to form a single nucleus on said nucleation surface and permitting a single crystal to grow from said single nucleus or form a polycrystal of a mass of single crystals grown from said single nucleus.

Further, the present invention provides a method for forming a crystal, which comprises subjecting a substrate having a nucleation surface with large nucleation density to doping of the whole surface of said nucleation surface, thereby ion implanting an ion by which nucleation density can be made smaller than the nucleation density of said nucleation surface, to form a nonnucleation surface with small nucleation density on the surface of said substrate, subsequently carrying out etching of an area which is a desired position of the nonnucleation surface and sufficiently small for crystal growth only from a single nucleus beyond the depth of the projection range of the implanted ion to form a nucleation surface so that the nucleation density of the fine surface exposed may become greater than the nucleation density of Said nonnucleation surface, then applying a crystal formation treatment on said substrate to form a single nucleus on said nucleation surface and permitting a single crystal to grow from said single nucleus or form a polycrystal of a mass of single crystals grown from said single nucleus.

DESCRIPTION OF THE PREFERRED EMBODIMENTS

Figure 1:
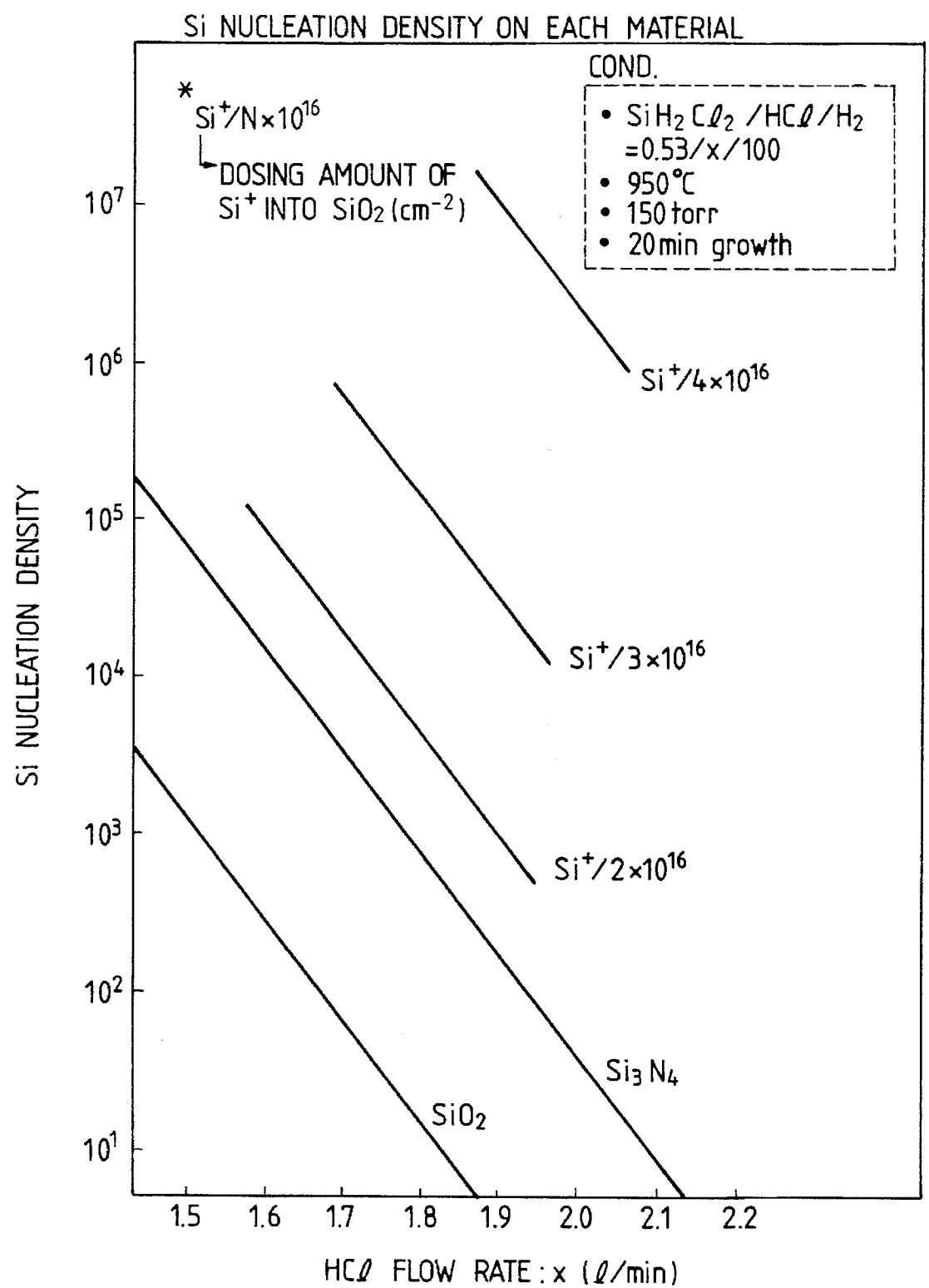
FIG. 1 is a graph showing the difference in Si nucleaton density on each material.
Figure 2A:
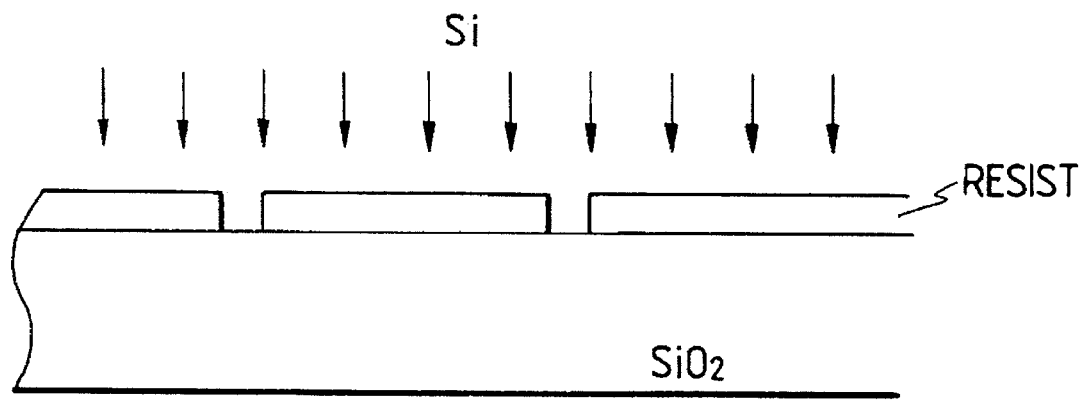
FIGS. 2A–2C are diagrams of the problem of residual resist denatured product when ion implantation is effected on the resist.
Figure 2B:
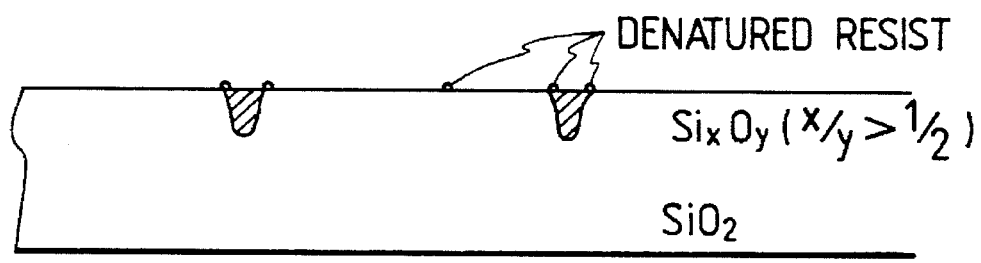
Figure 2C:
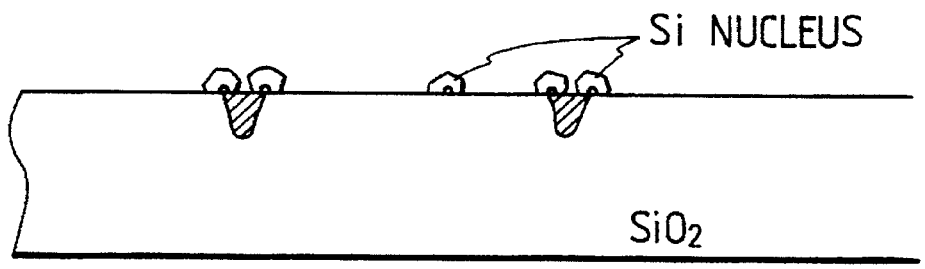

The present invention is now described about its embodiments by referring to the drawings.

Figure 3A:
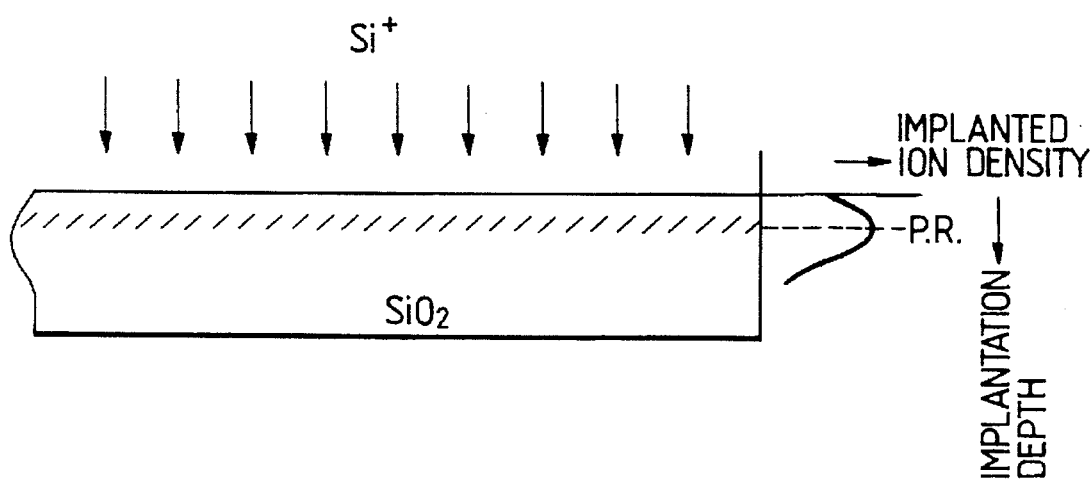
FIGS. 3A–3C are schematic illustrations of the embodiments of the present invention.

First, FIG. 3A shows an example in which Si ions are doped into the whole $SiO_2$ surface of a substrate having an amorphous $SiO_2$ surface by an ion implanter. The Si ions implanted into the above substrate exhibit a peculiar density profile (of 0 implanted atoms) by the acceleration voltage of ions during implanting. At this time, the depth where the atomic density of implanted atoms is the highest within the distribution range is indicated as Projected Range: hereinafter called P.R.

Figure 3B:
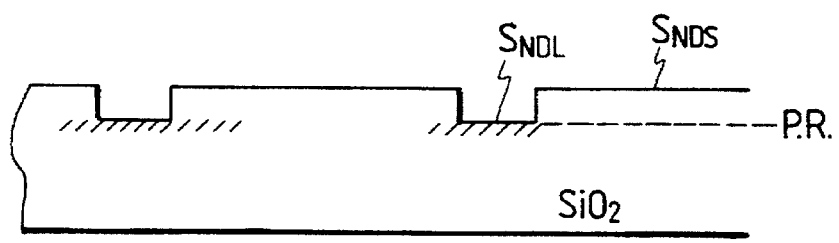

Next, FIG. 3B shows an example in which the sufficiently fine region is subjected to exposure treatment such as dry etching, wet etching, etc. to near the depth of P.R., thereby having the surface with larger nucleation density than the substrate surface exposed. The depth of this exposure treatment can be determined based on the calculation formula shown below. The exposed surface by the above exposure treatment at this time becomes the nucleation surface, and the $SiO_2$ surface where no exposure treatment as mentioned above applied becomes the nonnucleation surface.

Figure 3C:
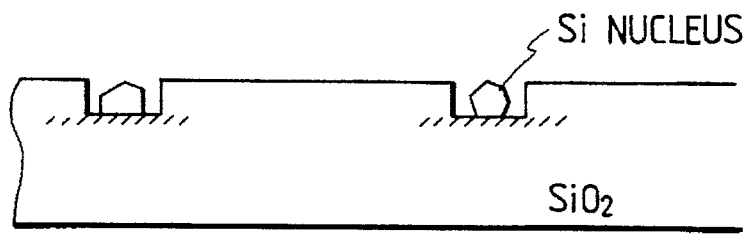

Next, FIG. 3C shows an example in which deposition is performed by use of selective nucleation conditions to form only one nucleus formed within the nucleation surface.

The examples of implanting Si ions into the substrate having amorphous $SiO_2$ surface shown in FIGS. 3A–3C are examples of ions which increase the nucleation density by ion implantation. As other examples, an example of ion which reduces the nucleation density by ion implantation is to be described below.

For example, oxygen ions are shallowly implanted on the whole surface of a substrate having amorphous silicon nitride surface by a low acceleration voltage.

By doing so, a nonnucleation surface is formed on the above substrate surface by reducing the nucleation density of said substrate surface.

Subsequently, a sufficiently fine region which is the desired position on the above nonnucleation surface is subjected to exposure treatment such as wet etching or dry etching beyound the depth of P.R., thereby having a surface with larger nucleation density than the substrate surface exposed, to form a substrate having the above nonnucleation surface and nucleation surface.

Subsequently, a crystal growth treatment is applied on the above substrate to permit a single crystal to grow on the above nucleation surface.

Further, ion implantation conditions, etc. are to be described in detail below.

As also previously described, the method of changing the nucleation density by implantation of ions into the substrate surface which becomes the nonnucleation surface has such merits that the difference in nucleation density ($\Delta$ND) can be made very large, and that the difference in nucleation ($\Delta$ND) can be controlled by controlling the dosing amount of implanted ions. Here, for carrying out selective nucleation, it is desirable to make the difference in nucleation density ($\Delta$ND) between the nucleation surface and the nonnucleation surface $10^2$-fold or more. When carrying out selective nucleation with good selectivity, the difference in nucleation density ($\Delta$ND) may be more preferably about $10^3$ to $10^6$-fold. In the case of ND($Si_3N_4$)/ND($SiO_2$), the difference in nucleation density ($\Delta$ND) is about $10^2$-fold or more, and sufficient selective nucleation may be also possible even under such conditions, but generation of an Error nucleus cannot be completely inhibited in some cases.

In carrying out selective nucleation, for reducing generation of an Error nucleus and preventing formation of crystal on the nonnucleation surface even under broad condition range, the difference in nucleation density ($\Delta$ND) may be preferably $10^3$-fold or more, but on the contrary, If the difference in nucleation ($\Delta$ND) is too large, it becomes necessary to use an operation such as lowering the whole nucleation density (ND) by flowing a large amount of HCl gas added for suppressing the nucleation density in order to grow a single crystal from only one nucleus on the nucleation surface. Then, the growth speed of the nucleus will become very slow to require a long time before a crystal with a desired size can be obtained, or the amount of the gas consumed becomes large, and therefore the practical upper limit of the difference in nucleation density ($\Delta$ND) may be appropriately about $10^6$-fold, In the embodiments of the present invention, as the material for the substrate surface in which ions are implanted, for example, insulating amorphous materials such as amorphous silicon oxide, amorphous silicon nitride, amorphous silicon oxynitride, etc. may be employed.

Also, as the kind of the ion to be implanted in the surface of the substrate in the present invention, which may also differ depending on the kind of the crystal to be formed, for example, ions which change the nucleation density of the substrate surface relative to the crystal to be formed, such as Si, As or O, etc. may be included.

Next, the implantation depth of ions is to be described. A depth which can be stably implanted by the ion implantation device used may be determined. In this connection, the P.R. of the implanted ions is not determined by the dosing amount, but only by the acceleration voltage of ions.

Here, the depth of ion implantation may be desirably a P.R. of 100 Å to 1100 Å. If the depth of P.R. is less than 100 Å, because the value of σ becomes small, there is a trend that when ions increasing the nucleation density are implanted, the difference in nucleation density ($\Delta$ND) between the nonnucleation surface of the substrate surface and the nucleation surface exposed by the exposure treatment cannot be taken sufficiently. Also, when ions are implanted to a depth lower than 100 Å, ion accelleration voltage is lower than 100 Å and ions can not be implanted stably in General. On the other hand, if P.R. exceeds 1100 Å, a long time is required for the exposue treatment, and also the ions implanted have a high energy, whereby the substrate surface tends to be damaged.

Subsequently, for effecting selective nucleation with good selectivity, the dosing amount of the ions to be implanted into the substrate surface may be preferably $1\times 10^{16}$ cm$^{-2}$ to $1\times 10^{17}$ cm$^{-2}$ by taking the difference in nucleation density ($\Delta$ND) between the nucleation surfce and the nonnucleation surface within the range as specified above. It may be more preferably to dose ions at $1.5\times 10^{16}$ cm$^{-2}$ to $8\times 10^{16}$ cm$^{-2}$, optimally $2\times 10^{16}$ cm$^{-2}$ to $4\times 10^{16}$ cm$^{-2}$.

Figure 5:
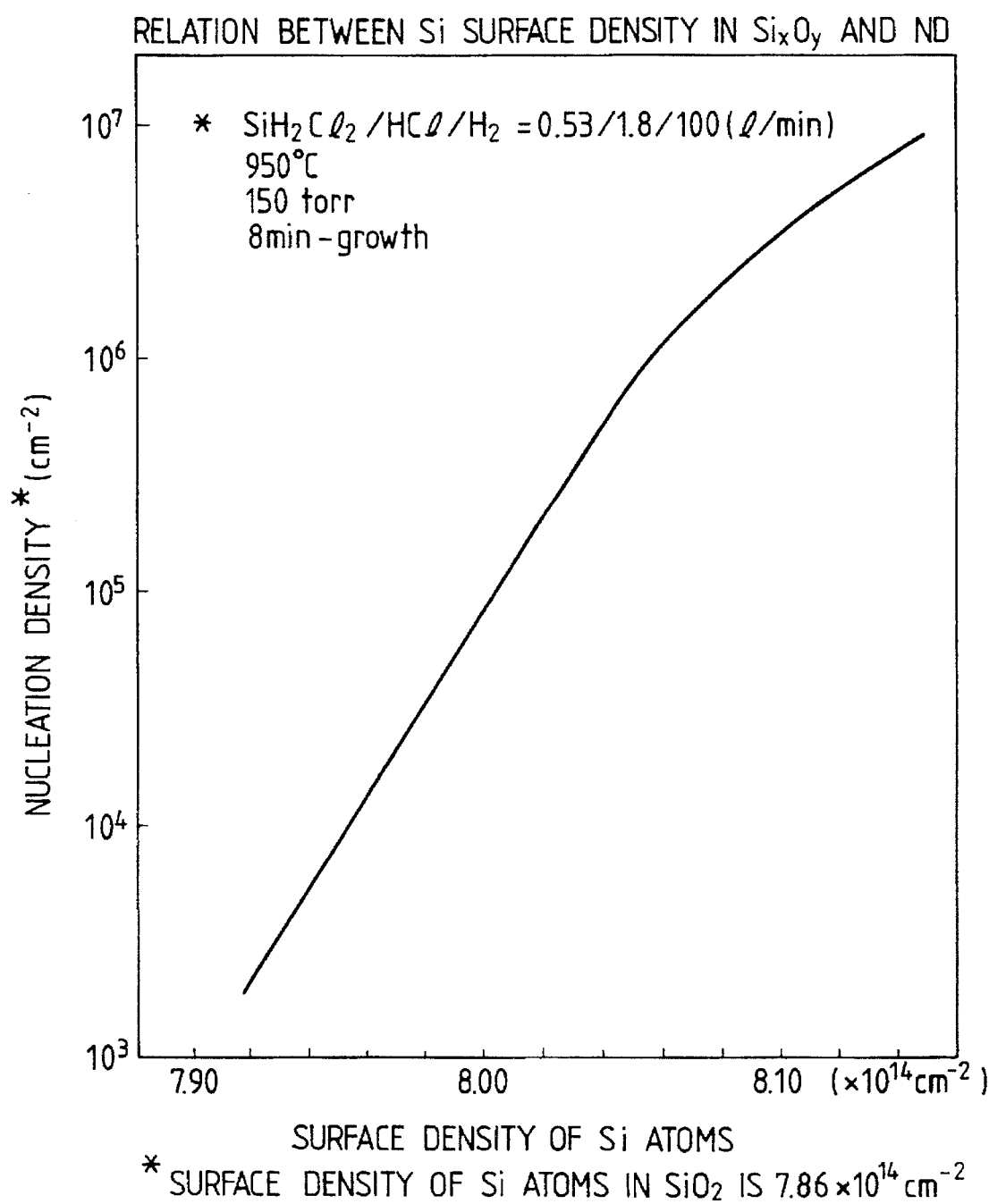
FIG. 5 shows the relationship between the Si atom density on the silicon oxide (SiOx) surface and the Si nucleation density.

Next, description is made about control of the difference in nucleation density ($\Delta$ND) which is also the most important point in applying the present invention. First, FIG. 5 shows the relationship between the Si atom density and the nucleation density(ND) on the surface when Si$^+$ is implanted on $SiO_2$ measured by the present inventor. The surface density of Si atom is a value calculated from the dosing amount of implanted ions, etc, and the value of the nucleation density (ND) is measured under the crystal growth treatment conditions shown below:

Gas flow rate ratio: $SiH_2Cl_2$/HCl/$H_2$=0.53/1.8/100;
Substrate temperature: 950° C.;
Pressure: 150 Torr;
Treatment time: 8 minutes.

The gas flow rate Patio is shown as $SiH_2Cl_2$/HCl/$H_2$= 0.53/1.8/100, but when HCl flow rate ratio is varied, only the nucleation density (ND) as a whole moves in parallel, and therefore the difference in nucleation density ($\Delta$ND) may be considered to be constant not depending on the flow rate ratio of HCl.

Figure 4:
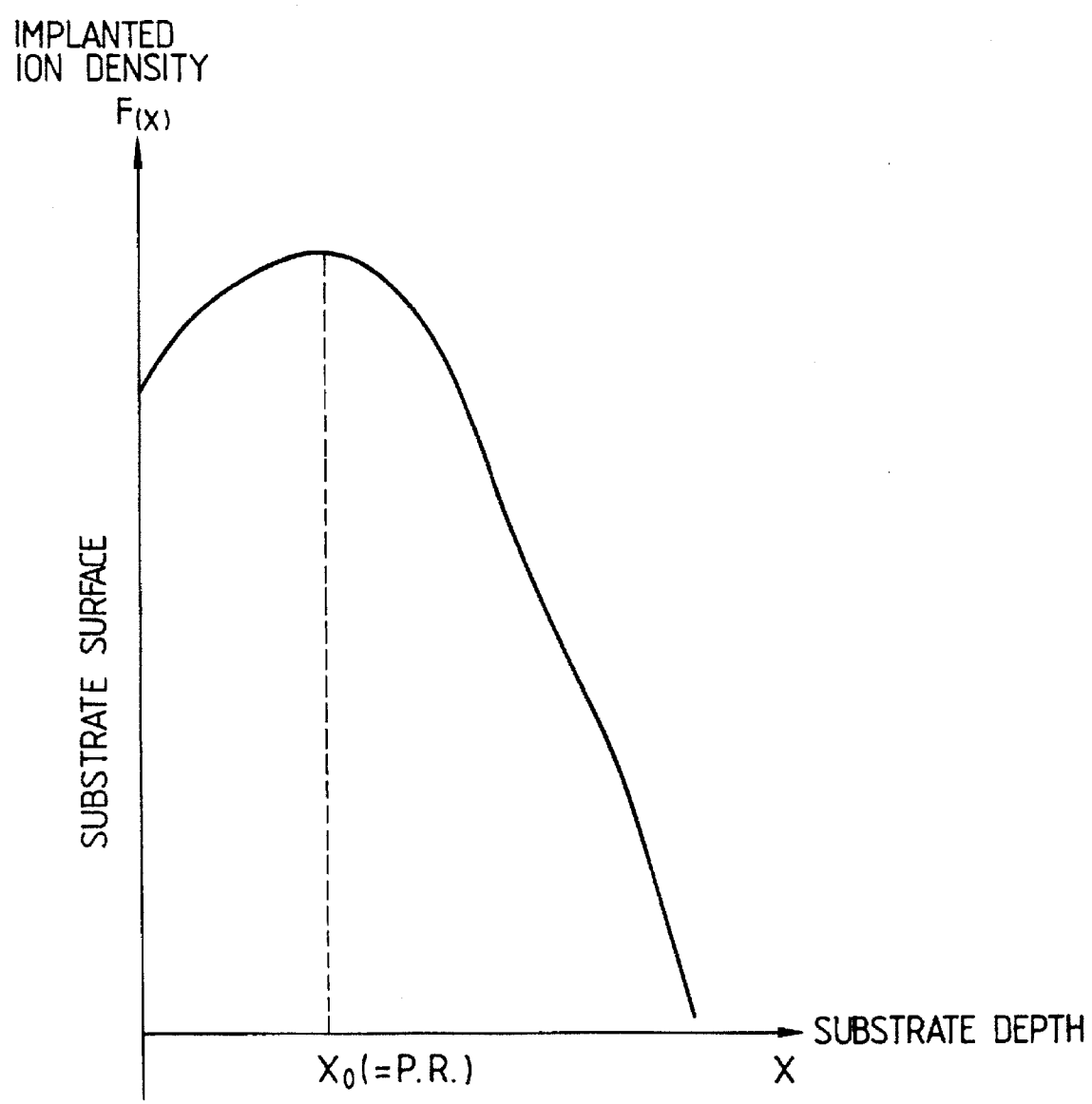
FIG. 4 is a depth profile of the implanted ion concentration when ions are implanted into the substrate.

Here, when ion implantation and exposure treatment such as wet etching or dry etching are effected to surface densities of Si implanted into $SiO_2$ of, for example, $7.95\times 10^{14}$ (cm$^{-2}$) and $8.15\times 10^{14}$ (cm$^{-2}$), it can be understood that the difference in nucleation density ($\Delta$ND) becomes ca. $10^3$-fold. Now, the relationship between the surface density D(x) and the depth direction (X) is to be described in ions may be approximated to a Gaussian distribution having a peak at a certain depth as shown in FIG. 4. When the substrate depth direction is made X, and the position of P.R. $X_0$, its concentration function F(X) can be represented by:

$$F(X) = \frac{N_0}{\sqrt{2\pi\sigma^2}} \exp\left(-\frac{(X-X_0)^2}{2\sigma^2}\right) \quad (1)$$

Therefore, the concentration F (0) of the implanted ions at the substrate surface becomes from X=0 as follows:

$$F(0) = \frac{N_0}{\sqrt{2\pi\sigma^2}} \exp\left(-\frac{X_0^2}{2\sigma^2}\right) \quad (2)$$

Here, $N_0$ is the dosing amount of ions, and σ is standard deviation. From this, the ratio of the concentration at a certain depth to that at the surface becomes as follows:

$$\frac{F(X)}{F(0)} = \exp\left\{-\frac{(X-X_0)^2}{2\sigma^2} + \frac{X_0^2}{2\sigma^2}\right\} \quad (3)$$

$$= \exp\{(2XX_0 - X^2)/2\sigma^2\}$$

On the other hand, the ratio of surface density of the implanted ions is given as follows:

$$\frac{D(X)}{D(0)} = \left(\frac{F(X)}{F(0)}\right)^{2/3} = \exp\{(2XX_0 - X^2)/3\sigma^2\} \quad (4)$$

From the depth of P.R. and the dosing amount determined by the acceleration voltage of implantation by use of these formulas, the surface density D (0) is calculated, and it can be determined what depth from the surface should be subjected to the exposure treatment from the above formulas, for the difference in nucleation dentisy (ΔND) to be obtained from the graph shown in FIG. 5. In the following, Examples are shown.

To rearrange the above formula (4) with respect to X, it becomes as follows:

$$X^2 - 2XX_0 + 3\sigma^2 \ln \frac{D_{(x)}}{D_{(0)}} = 0 \quad (5)$$

Since the above formula (5) is a quadratic function of X, generally two solutions are obtained. Here, for forming a crystal from a single nucleus from the bottom of a concavity formed by the exposure treatment, when an ion which increases the nucleation density relative to the crystal to be grown is implanted, it is preferable to select the smaller solution, while when an ion which reduces the nucleation density relative to the crystal to be grown is implanted, it is preferable to select the larger solution.

The above exposure treament may include, for example, wet etching by use of an etchant containing HF, etc., dry etching by use of $CHF_3/C_2F_6$ gas, $CF_4/H_2$ gas, etc.

Crystal growth treatment is applied on the substrate having the nonnucleation surface and the nucleation surface with sufficiently fine area for forming a single crystal from a single nucleus thus obtained.

As the above crystal growth treatment, the gas phase methods including the chemical vapor deposition (CVD) method such as the plasma CVD method, the optical CVD method, the MOCVD method, etc., or the liquid phase method such as the gradual cooling method, the temperature gradient method, etc. may be preferred.

As the gases to be introduced, there may be employed starting materials containing the constituent elements of the crystal to be formed which can be supplied in gaseous state and gases of HCl, etc. for inhibiting undesirable nucleus generation on the above substrate surface, and gases such as $H_2$, etc.

When a doped crystal is to be formed, a gas containing the element to be doped may be also added into the above gases introduced.

Specific examples of the gases to be introduced may include, for example, $(CH_3)_3Ga/AsH3/HCl/H_2)$, $(SiH_2Cl/HCl/H_2)$, $(SiHCl_3/HCl/H_2)$, $(SiCl_4/H_2)$, $(SiCl_4/HCl/H_2)$, $(SiH_4/HCl/H_2)$, etc.

Also, for selective nucleation with good selectivity at a desired position, the pressure during the crystal growth treatment may be preferably 250 Torr or lower. Here, in order to obtain high selectivity without lowering the crystal growth speed, the pressure may be more preferably 80 Torr to Torr, optimally 100 Torr to 150 Torr.

For formation of a crystal having desired characteristics with good selectivity, the substrate temperature during the crystal growth treatment may be preferably 800° C. to 1200° C., more preferably 900° C. to 1100° C., in the case of the hot CVD method. In the case of other gas phase methods, the substrate temperature may be preferably 500° C. to 800° C., more preferably 600° C. to 700° C.

Figure 6:
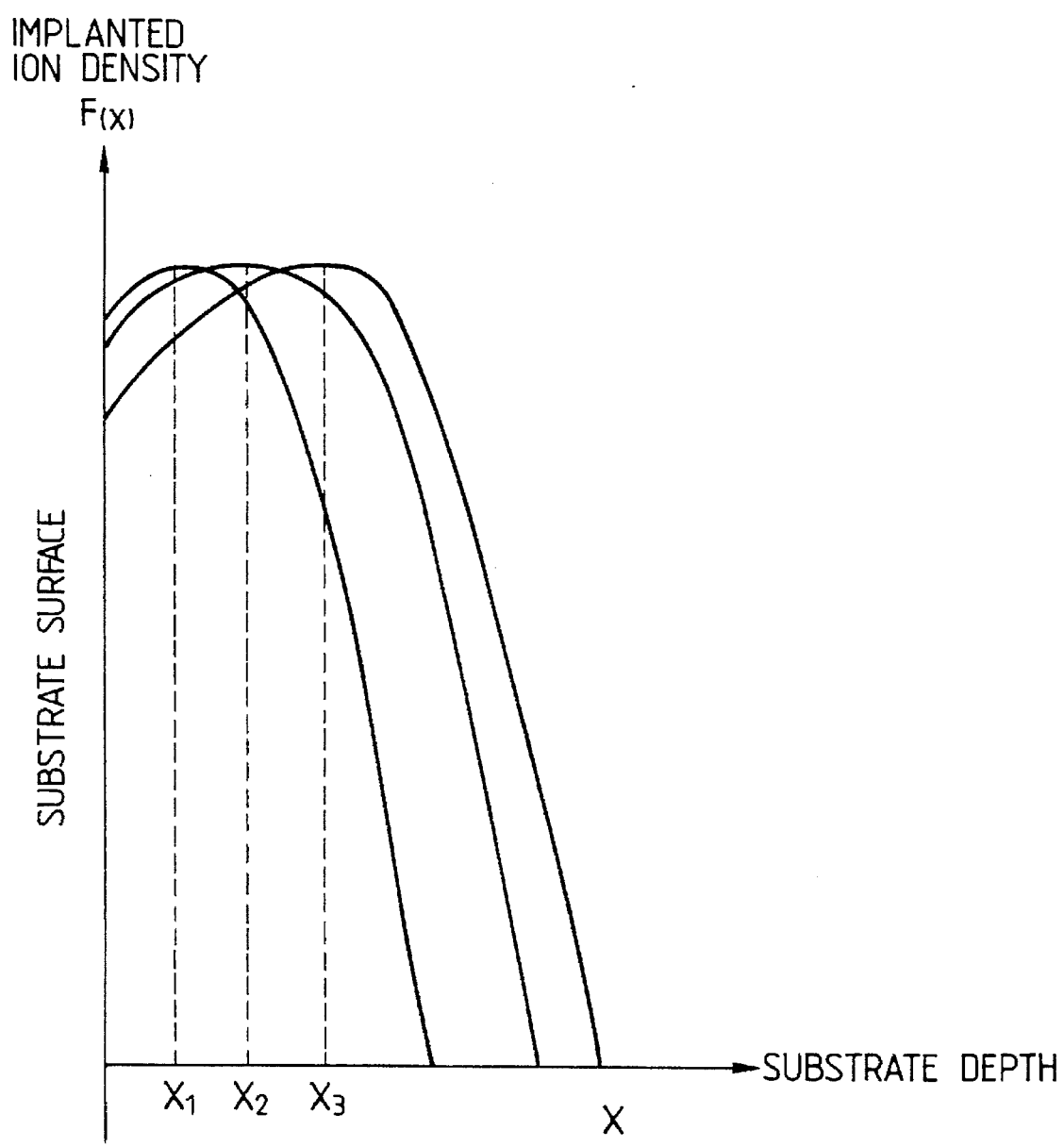
FIG. 6 is a depth profile of the implanted ion density when ions are implanted into the substrate in multiple stages.

The example as described above is an example in which ion implantation to a substrate surface is effected at a constant acceleration voltage. As an example of other conditions for effecting ion implantation, an example of performing ion implantation by multi-stage implantation as shown in FIG. 6 is to be described below.

When ions are implanted with various acceleration voltages in the same dosing amount, the respective positions of P.R. are varied as $X_1$, $X_2$ and $X_3$, but the atomic concentrations implanted at the respective depths become generally $F(X_1)=F(X_2)=F(X_3)$.

Accordingly, since the same nucleation density (ND) can be obtained even if either depth of $X_1$ to $X_3$ may be exposed in carrying out the exposure treatment, it is possible to form a substrate having a nonnucleation surface and a nucleation surface more easily with stability between the substrates and with good reproducibility without controlling the depth of the exposure treatment very accurately.

EXAMPLE 1

Example 1 of the present invention is described by referring to FIG. 3A–3C. First, the surface of a 4 inch Si wafer was thermally oxidized to form an amorphous $SiO_2$ layer with a thickness of 2000 Å as the material for the nonnucleation surface thereon. There, Si ions were implanted by an ion implanter at an acceleration voltage ot 20 KeV and a dosing amount of $1 \times 10^{16}$ cm$^{-2}$ P.R. ($X_0$) when Si was implanted at 20 KeV on the above $SiO_2$ was 211 Å, and the standard deviation 91 Å. From the formula (4), the surface Si atom density (hereinafter written as S.D.) under the above conditions can be understood to be $7.934 \times 10^{14}$ cm$^{-2}$. From the graph in FIG. 5 since the nucleation density ND is ca. $3 \times 10^3$ when S.D.=$7.934 \times 10^{14}$, it can be understood that etching may be effected to the depth (X) where S.D.=$8.10 \times 10^{14}$ cm$^{-2}$ for obtaining a difference in nucleation density of about $10^3$-fold.

Since the Si atom density on the $SiO_2$ surface before implantation of Si ions is $7.863 \times 10$ cm$^{-2}$, the Si atom density D(0) implanted into the $SiO_2$ surface is:

$$D(0) = 7.934 \times 10^{14} - 7.863 \times 10^{14}$$
$$= 7.1 \times 10^{12},$$

and the Si atom density D(X) implanted at the depth (X) is:

$$D(X) = 8.10 \times 10^{14} - 7.863 \times 10^{14}$$
$$= 2.37 \times 10^{13}.$$

Accordingly, from the formula (5):

$$X = X_0 \pm \sqrt{X_0^2 - 3\sigma^2 \ln\{D_{(x)}/D_{(o)}\}} \quad (6)$$

from which two solutions of:

X=326 Å, 96 Å were obtained. The reason why two solutions are obtained is because the formula (5) becomes the quadratic function of X.

In this Example, as the exposure treatment, a fine region of 2 μm square on the $SiO_2$ surface was etched by wet etching with a solution of HF diluted with water to a depth of 96 Å to form nucleation surfaces with 50 μm intervals in both longitudinal and lateral directions.

As described above, a substrate as shown in FIG. 3B was obtained.

Next, formation and growth of Si nucleus were performed under the following conditions:

Amounts of gases introduced: $SiH_2Cl_2/HCl/H_2=0.53/2.0/100$ (liter/min.);
Substrate temperature: 950° C.;
Pressure: 150 Torr;
Growth time: 30 min.

On the substrate, a polycrystalline film was formed which was controlled in grain size to about 50 μm by formation of grain boundaries with single crystals grown from the above nucleation surface being contacted mutually with one another at approximately the center between the nonnucleation surface and the nucleation surface.

SEM photographs of the substrate surface having the polycrystalline film formed thereon were taken at any desired 10 points of regions each of about 1 mm×1 mm, and formation of the crystal on the nucleation surface and the crystal grown from the Error nucleus on the nonnucleation surface were observed, to calculate the growth ratio on the nucleation surface and the growth density of the Error nucleus. The growth ratio on the nucleation surface was found to be and the growth density of the Error nucleus on the nonnucleation surface $0/cm^2$, thus giving an extremely high selectivity.

EXAMPLE 2

Crystal growth treatment was applied in the same manner as in Example 1 except for making the intervals mutually between the nucleation surfaces on the substrate surface 200 μm.

On the substrate, single crystals with grain sizes of about 60 μm were formed with good selectivity.

A plurality of substrates having an amorphous silicon oxide film formed to a layer thickness of 1 μm on a base material made of tungsten according to the conventional plasma CVD method were formed.

Into the above amorphous silicon oxide surface were implanted Si ions by an ion implanter at the dosing amount of $1.3\times10^{16}$ $cm^{-2}$ in the three stages of acceleration voltages of 20 KeV, 30 KeV and 40 KeV.

At this time, P.R. ($X_1$) was 211 Å, P.R. ($X_2$) 312 Å and P.R. ($X_3$) 417 Å.

The amorphous silicon oxide film surface of the above substrate implanted with Si ions was etched to a depth of 300 Å at fine area regions of 4 μm square at intervals of 100 μm. The reactive ion etching was effected under the etching conditions shown below to form a plurality of substrates having a nonnucleation surface and a nucleation surface:
Flow rate ratio of gases introduced: $CHF_3/C_2F_6=18/42$
Discharging power: 2.1 KW
Pressure: 70 Pa.

On each of the above substrates thus obtained, Si crystal was formed under the following crystal growth treatment conditions:
Flow rate ratio of gases introduced: $SiH_2Cl_2/HCl/H_2=0.53/2.0/100$
Substrate temperature: 1030° C.
Pressure: 150 Torr
Growth time: 25 minutes.

As the result, on both the same substrate and each substrate, single crystals with grain sizes of about 50 μm could be formed easily without variance between the respective substrates without growing crystals of Error nucleus on the nonnucleation surface and with good selectivity at desired positions of the nucleation surfaces arranged.

EXAMPLE 4

Crystal growth treatment was applied in the same manner as in Example 1 except for depositing an amorphous silicon nitride to a layer thickness of 5000 Å according to the plasma CVD method on the 4 inch Si wafer in Example 1. On the substrate, a polycrystalline film controlled in grain size to about 50 μm was formed.

EXAMPLE 5

On an aluminum oxide base material, silicon nitride with a layer thickness of 1.2 μm was formed.

Into the above silicon nitride surface, oxygen ions were implanted to a P.R. of 120 Å at a dosing amount of $2\times10^{16}$ $cm^{-2}$.

On the above silicon nitride surface implanted with oxygen ions, openings with intervals of 80 μm, 1.8 μmφ and a depth of 400 Å were formed by use of the reactive ion etching (RIE) method to form a substrate having the nonnucleation surface and the nucleation surface.

On the substrate, crystal growth treatment was applied under the following conditions.
Flow rate ratio of gases introduced: $SiH_2Cl_2/HCl/H_2=0.53/1.6/100$
Substrate temperature: 990° C.
Pressure: 120 Torr
Growth time: one hour.

As the result, a polycrystalline Si film controlled in grain size to about 80 μm was formed with good selectivity on the above substrate.

EXAMPLE 6

Into the surface of a quartz glass with a thickness of 3 mm, As ions were implanted to a P.R. of 450 Å in a dosing amount of $3\times10^{16}$ $cm^{-2}$.

The above quartz glass surface implanted with the As ions was subjected to wet etching with a buffered hydrofluoric acid at fine regions of 2 μm square with intervals of 10 μm to the depth of P.R. (450 μm) to form a substrate having the nonnucleation surface and the nucleation surface.

On this substrate, crystal growth treatment was applied under the following conditions.
Flow rate ratio of gases introduced: $(CH_3)_3Ga/t-C_4H_9AsH_2/H_2=1/35/8000$.
Substrate temperature: 670° C.
Pressure: 80 Torr
Growth time: 100 minutes.

As the result, a GaAs polycrystal with a grain size of 10 μm could be formed with good selectivity on the above substrate.

I claim:
1. A method for forming a crystal, which comprises:
implanting ions on the whole area of a substrate having an amorphous nonnucleation surface with a small nucleation density, said ions being capable of making the nucleation density of said substrate greater than said small nucleation density of said amorphous nonnucleation surface, wherein a distribution of the nucleation density is formed by doping ions to provide an ion concentration in a thickness direction of said substrate such that the nucleation density is greater inside of said substrate than at the surface of said substrate;
etching a selected area of said amorphous nonnucleation surface, said area being small enough to form only a single nucleus from which a single-crystal is vapor deposited, to a depth within a range of the implanted ions, thereby forming an exposed nucleation surface with a greater nucleation density than said small nucleation density of said amorphous nonnucleation surface; and growing by vapor deposition a single crystal or a polycrystal comprising a mass of single crystals from said single nucleus.

2. A method according to claim 1, wherein the dosing amount of said ion to be implanted is $1\times10^{16}$ (cm$^{-2}$) to $1\times10^{17}$ (cm$^{-2}$).

3. A method according to claim 1, wherein the ion concentration becomes greatest at a depth of 100 Å to 1100 Å inside the substrate.

4. A method for forming a crystal, which comprises:

implanting ions on the whole area of a substrate having an amorphous surface with a large nucleation density, wherein a distribution of the nucleation density is formed by doping inos to provide an ion concentration in a thickness direction of said substrate such that the nucleation density is greater inside of said substrate than at the surface of said substrate, said ions being capable of making the nucleation density of said substrate smaller than said large nucleation density of said amorphous surface by doping, thereby forming a nonnucleation surface with a small nucleation density on the amorphous surface of said substrate;

etching a selected area of said nonnucleation surface, said area being small enough to form only a single nucleus from which a single-crystal is vapor deposited, to a depth beyond a range of the implanted ions, thereby forming an exposed nucleation surface with a greater nucleation density than said small nucleation density of said nonnucleation surface; and growing by vapor deposition a single crystal or a polycrystal comprising a mass of single crystals from said single nucleus.

5. A method according to claim 4, wherein the dosing amount of said ion to be implanted is $1\times10^{16}$ (cm$^{-2}$) to $1\times10^{17}$ (cm$^{-2}$).

6. A method according to claim 4, wherein the ion concentration becomes greatest at a depth of 100 Å to 1100 Å inside the substrate.

* * * * *

UNITED STATES PATENT AND TRADEMARK OFFICE
CERTIFICATE OF CORRECTION

PATENT NO. : 5,653,802

DATED : August 5, 1997

INVENTOR(S): KENJI YAMAGATA                    Page 1 of 4

It is certified that error appears in the above-identified patent and that said Letters Patent is hereby corrected as shown below:

[57] ABSTRACT

Line 6, "to/he" should read --to the--.

COLUMN 1

Line 25, "devices" should read --devices,--.
    Line 30, "from liquid" should read --from the liquid--.
    Line 40, "done" should be deleted.
    Line 48, "developed" should read --develop--.
    Line 49, "be" should be deleted.
    Line 60, "enlarger of" should read --larger--.
    Line 63, "of" should be deleted.

COLUMN 2

Line 1, "have been actively "resarches"" should read --has been active research--.
    Line 5, "researches" should read --research--.
    Line 9, "I" should be deleted.
    Line 24, "longer" should read --long--.
    Line 34, "polycrystlline" should read --polycrystalline--.
    Line 59, "Greatly" should read --greatly--.
    Line 67, "time enlarge" should read --time to enlarge--.

UNITED STATES PATENT AND TRADEMARK OFFICE
CERTIFICATE OF CORRECTION

PATENT NO. : 5,653,802

DATED : August 5, 1997

INVENTOR(S): KENJI YAMAGATA

It is certified that error appears in the above-identified patent and that said Letters Patent is hereby corrected as shown below:

COLUMN 3

```
Line 19, "substraate" should read --substrate--.
Line 22, "(AND)" should read (ΔND)--.
Line 54, "St." should read --Si.--.
Line 63, "nuclues" should read --nucleus-- and
    "which" should be deleted.
Line 64, "is the" should be deleted.
```

COLUMN 4

```
Line 33, SiO" should read --SiC--.
```

COLUMN 6

```
Line 2, "Said" should read --said--.
Line 35, "0" should be deleted.
```

COLUMN 7

```
Line 2, "beyound" should read --beyond--.
```

UNITED STATES PATENT AND TRADEMARK OFFICE
CERTIFICATE OF CORRECTION

PATENT NO. : 5,653,802

DATED : August 5, 1997

INVENTOR(S): KENJI YAMAGATA

It is certified that error appears in the above-identified patent and that said Letters Patent is hereby corrected as shown below:

COLUMN 8

Line 2, "accelleration" should read --acceleration--.
    Line 3, "General." should read --general.--.
    Line 12, "surfce" should read --surface--.
    Line 31, "Patio" should read --ratio--.

COLUMN 9

Line 9, "dentisy" should read --density--.
    Line 58, "to Torr," should read --to 170 Torr,--.

COLUMN 10

Line 24, "ot" should read --of--.
    Line 36, "7.863 X 10 $cm^{-2}$" should read --7.863 X $10^{14}$ $cm^{-2}$--.

COLUMN 11

Line 20, "be and" should read --be 99.9%, and--.
    Line 64, "EXAMPLE 4" should read --EXAMPLE 3--.

COLUMN 12

Line 6, "EXAMPLE 5" should read --EXAMPLE 4--.
    Line 28, "EXAMPLE 6" should read --EXAMPLE 5--.

UNITED STATES PATENT AND TRADEMARK OFFICE
CERTIFICATE OF CORRECTION

PATENT NO. : 5,653,802

DATED : August 5, 1997

INVENTOR(S) : KENJI YAMAGATA

It is certified that error appears in the above-identified patent and that said Letters Patent is hereby corrected as shown below:

<u>COLUMN 13</u>

Line 14, "inos" should read --ions--.

Signed and Sealed this

Thirty-first Day of March, 1998

Attest:

BRUCE LEHMAN

Attesting Officer    Commissioner of Patents and Trademarks